(12) United States Patent
Sohn

(10) Patent No.: US 6,903,455 B2
(45) Date of Patent: Jun. 7, 2005

(54) SIDE BRAZE PACKAGES

(75) Inventor: Young Ho Sohn, Seoul (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 10/748,428

(22) Filed: Dec. 30, 2003

(65) Prior Publication Data

US 2004/0207058 A1 Oct. 21, 2004

(30) Foreign Application Priority Data

Dec. 30, 2002 (KR) ................................ 10-2002-0086248

(51) Int. Cl.$^7$ ................................................ H01L 23/04

(52) U.S. Cl. ....................................... 257/698; 257/777

(58) Field of Search ................................ 257/686, 698, 257/774, 777, 778, 784

(56) References Cited

U.S. PATENT DOCUMENTS 6,380,631 B2 * 4/2002 Mess et al. ................. 257/777

* cited by examiner

Primary Examiner—Hoai Pham
(74) Attorney, Agent, or Firm—Hanley, Flight & Zimmerman, LLC

(57) ABSTRACT

Side braze packages for semiconductor devices are disclosed. A disclosed side braze package includes a lead located at a sidewall of a main body having a groove. A first semiconductor chip is flip chip bonded on the groove through a solder bump. A second semiconductor chip is stacked on the first semiconductor chip. A first through hole is formed from an upper portion of the main body to a lower portion of the main body around an inner sidewall of the groove. A first line is connected to the lead through the solder bump and the first through hole. A second line is connected to the lead through the first through hole. A wire interconnects a pad of the second semiconductor to the second line.

7 Claims, 1 Drawing Sheet

SIDE BRAZE PACKAGES

FIELD OF THE DISCLOSURE

The present disclosure relates to semiconductor packages; and, more particularly, to side braze packages for enhancing packaging efficiency.

BACKGROUND

Packaging is the process in which a semiconductor is enclosed for protection and to provide ease of handling and usage.

A side braze package is one of several types of packages. A conventional side braze package includes a lead installed at an outer wall of a main body having a groove and connected to an external power supply. Also, a semiconductor chip is bonded on the groove using an adhesive. A wire interconnects a bonding pad of the semiconductor chip to a contact line of the main body.

To increase integration efficiency of the package, since one semiconductor chip is embedded on the groove in the conventional side braze package, another package is stacked on the chip.

DETAILED DESCRIPTION

Figure 1:
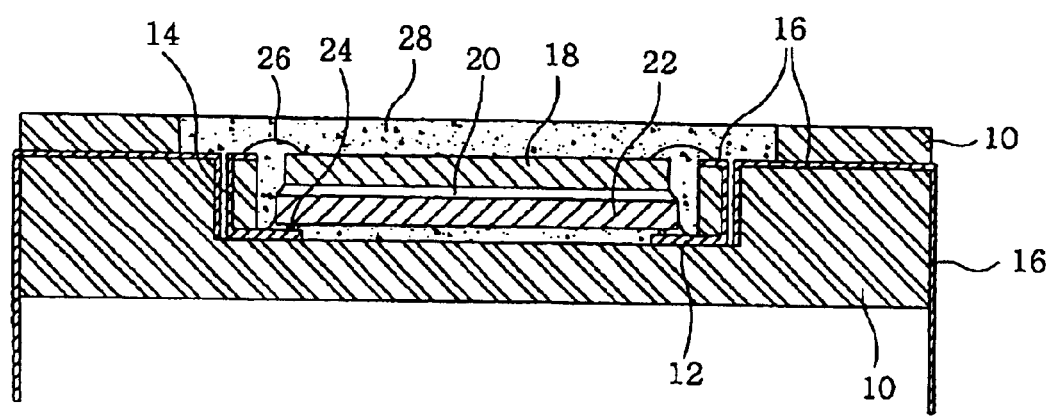
FIG. 1 is a cross sectional view of an example side braze package constructed in accordance with the teachings of the present disclosure.

FIG. 1 is a cross sectional view of an example side braze package. Referring to FIG. 1, two semiconductor chips 18 and 22 are packaged in the side braze package.

In the side braze package of FIG. 1, a groove located in an upper portion of a main body 10 is made of a conductive braze. A lead 16 is formed on an outer wall of the main body 10. This lead 16 is connected to an external power supply. A first flip chip 22 is bonded on a lower portion of the groove through a solder bump 24 and a second flip chip 18 is stacked onto the first flip chip 22 by means of an adhesive 20 therebetween. Through holes 14 are formed from the upper portion to the lower portion around an inner sidewall of the groove to thereby penetrate a first line 12 connecting the lead 16 to the solder bump 24. Also, a second line 16 is connected to the lead through the through hole 14.

A pad of a second semiconductor chip 18 is wire bonded with the second wire 16. The groove is molded with an encapsulant 28. The main body 10 can be made of a ceramic material.

Figure 2:
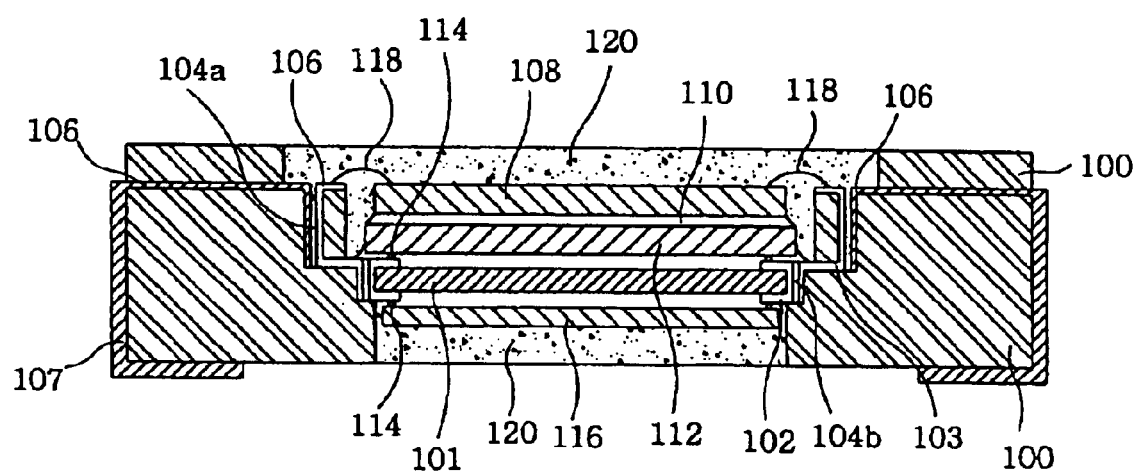
FIG. 2 is a cross sectional view of another example side braze package constructed in accordance with the teachings of the present disclosure.

FIG. 2 is a cross sectional view of another example side braze package. Three semiconductor chips 108, 112 and 116 are packaged in the side braze package in the example of FIG. 2.

A lead 107 is formed on an outer wall of a main body 100. The main body 100 has first and a second grooves formed at an upper portion and a lower portion thereof with reference to a support layer 101. The lead 107 is connected to an external power supply. A first semiconductor chip 112 is flip chip bonded on a lower portion of the first groove through a solder bump 114. A second semiconductor chip 108 is stacked onto the first semiconductor chip 112 by means of an adhesive 110 therebetween. A through hole 104a is formed from the upper portion to the lower portion around an inner sidewall of the first groove to thereby penetrate a first line 103 connecting the lead 107 to the solder bump 114 formed on the support layer 101. Also, the lead 107 is connected to a second line 106 through a second through hole 104b penetrating the support layer 101. Also, a pad of the second semiconductor chip 108 is connected to the second line 106 using a wire 118. A third semiconductor chip 116 is flip chip bonded using the solder bump 114 formed under the support layer 101 and connected to the first line 103. A vacant space in the groove is molded using an encapsulant.

In other examples, more than two semiconductor chips, (e.g., four semiconductor chips) can be packaged in the main body of the side braze package of FIG. 2. For example, a fourth semiconductor (not shown) can be further mounted under the third semiconductor 116. In such an example, a through hole for connecting the line of the third semiconductor chip 116, a wire for connecting a pad of the fourth semiconductor chip with the line connected to the through hole may be further needed.

As described above, since two or more semiconductor chips can be mounted in the side braze package, packaging efficiency can be enhanced.

From the foregoing, persons of ordinary skill in the art will appreciate that side braze packages have been disclosed which are capable of incorporating two or more semiconductor chips to thereby enhance packaging efficiency.

An illustrated example side braze package includes: a lead located at a sidewall of a main body having a groove, and connected to an external power supply; a first semiconductor chip being flip chip bonded on the groove through a solder bump; a second semiconductor chip being stacked on the first semiconductor chip; a first through hole formed from an upper portion to a lower portion around an inner sidewall of the groove; a first line connected to the lead through the solder bump and the first through hole; a second line connected to the lead through the first through hole; and a wire for connecting a pad of the second semiconductor to the second line.

Although certain example methods and apparatus have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A side braze package comprising:
   a main body having a groove;
   a lead located at a sidewall of, the main body, the lead being connectable to an external power supply;
   a first semiconductor chip flip chip bonded on the groove through a solder bump;
   a second semiconductor chip stacked on the first semiconductor chip;
   a first through hole formed near an inner sidewall of the groove;
   a first line connected to the lead through the solder bump and the first through hole;
   a second line connected to the lead through the first through hole; and
   a wire to connect a pad of the second semiconductor to the second line.

2. A side braze package as defined in claim 1, wherein the groove is filled with an encapsulant.

3. A side braze package as defined in claim 1, wherein the main body comprises a ceramic material.

4. A side braze package as defined in claim 1, wherein the groove is punctured from an upper portion of the main body to a lower portion of the main body.

5. A side braze package as defined in claim 4 further comprising a support layer fixed at an outer sidewall of the groove, the support layer being positioned substantially parallel to the first semiconductor and supporting the first semiconductor chip.

6. A side braze package as defined in claim 5 further comprising a third semiconductor chip flip chip bonded under the support layer, and a second through hole formed from an upper portion of the main body to a lower portion of the main body near the inner side wall of the groove, wherein the first line is connected to the third semiconductor via the second through hole.

7. A side braze package as defined in claim 6 further comprising a fourth semiconductor chip stacked on the third semiconductor chip, a third through hole being formed from the upper portion of the main body to the lower portion of the main body near the inner sidewall of the groove, and a second wire interconnecting a pad of the fourth semiconductor chip with a third line of the third semiconductor chip.

* * * * *